United States Patent [19]

Mitchell et al.

[11] Patent Number: 4,806,201

[45] Date of Patent: Feb. 21, 1989

[54] USE OF SIDEWALL OXIDE TO REDUCE FILAMENTS

[75] Inventors: Allan T. Mitchell, Dallas; Howard L. Tigelaar, Collin; Shaym G. Garg, Lubbock; Kalipatnam V. Rao, Plano, all of Tex.

[73] Assignee: Texas Instruments Incorporated, Dallas, Tex.

[21] Appl. No.: 170,528

[22] Filed: Mar. 21, 1988

Related U.S. Application Data

[63] Continuation of Ser. No. 937,758, Dec. 4, 1986, Pat. No. 4,749,443.

[51] Int. Cl.$^4$ .................. H01L 21/306; B44C 1/22; C03C 15/00; C03C 25/06
[52] U.S. Cl. .................. 156/653; 156/657; 156/659.1; 156/662; 437/43

[58] Field of Search .............. 156/643, 646, 653, 657, 156/659.1, 661.1, 662; 357/23.14, 41, 49; 437/43, 48, 49, 50, 52, 191-228, 233, 235, 238-241

[56] References Cited

U.S. PATENT DOCUMENTS

| | | | |
|---|---|---|---|
| 4,566,175 | 1/1986 | Smayling et al. | 437/43 |
| 4,628,588 | 12/1986 | McDavid | 29/591 X |
| 4,713,142 | 12/1987 | Mitchell et al. | 156/653 |

Primary Examiner—William A. Powell
Attorney, Agent, or Firm—Rodney M. Anderson; Leo N. Heiting; Melvin Sharp

[57] ABSTRACT

The disclosure relates to a method for reducing filament formation over the BN+ oxide in semiconductor devices wherein a sidewall oxide is formed on the side walls of the first polysilicon layer prior to subsequent formation of the intermediate insulating layer, formation of a second polysilicon layer and subsequent anisotropic etch to provide for removal of all polysilicon over the field oxide.

14 Claims, 2 Drawing Sheets

4,806,201

USE OF SIDEWALL OXIDE TO REDUCE FILAMENTS

This is a continuation of application Ser. No. 937,758, filed Dec. 4, 1986, U.S. Pat. No. 4,749,443.

BACKGROUND OF THE INVENTION

1. Field of the Invention

This invention relates to the manufacture of semiconductor devices having at least two layers of overlapping topologies formed during device manufacture, such as EPROMs, EEPROMs and the like and, more specifically, to reduction of filament formation adjacent to the sides of the underlying layers thereof.

2. Brief Description of the Prior Art

In the manufacture of semiconductor devices having plural layers of polycrystalline silicon (polysilicon) therein, a problem of polysilicon filament formation has existed wherein filaments of polysilicon are formed during the steps where lines formed of the second polysilicon layer (poly 2) and which cross underlying polysilicon lines (poly 1) are etched. In the prior are formation of an EPROM or EEPROM device, an interlevel dielectric is deposited on top of a deposited poly 1 layer. The interlevel dielectric and the poly 1 layer are then etched together to form the underlying poly 1 structures. During this said interlevel dielectric and poly 1 etch, the sides of the poly 1 layer topologies are exposed, whereby subsequent deglazes and oxidations act upon this poly 1 sidewall as will be explained hereinbelow. The first gate oxide is wet etched, producing an undercut under the poly 1 lines. Next the gate oxide for periphery devices is grown, producing a thick oxide on the top corners of the poly 1 layer and then the second layer of polysilicon (poly 2) is deposited and etched. There are three processes within this flow or series of processing steps which form filaments. First, poly 1 filaments are formed because a thermal oxide is grown on the poly 1 side walls. This forms a thicker oxide on the top corners of the poly 1 which will hide a filament when the poly 1 is later etched, as for example, during the stacked gate etch of an EPROM or EEPROM transistor. Second, the undercut of poly 1 formed during the deglaze will hide a poly 2 filament when the poly 2 is later etched, as, for example, during the stacked gate etch of an EPROM or EEPROM transistor or during the poly 2 etch of MOS transistors, as in DRAMs, SRAMs, logic circuits, etc. Third, since the vertical thickness of poly 2 is much greater adjacent to steps over underlying topography, such as a poly 1 line, a filament will be formed if an anisotropic poly 2 etch is used, as, for example, during the poly 2 etch of VLSI circuits, where small geometries are required and one can not use an isotropic etch.

In the prior art, either an isotropic poly 2 etch is used or a filament cutting mask is used to eliminate the filament. The isotropic polysilicon etch has the disadvantage of requiring more relaxed design rules and therefor can not be used on VLSI circuits where high density is an issue. The filament cutting mask has the disadvantage of requiring an extra mask which has a critical alignment to the underlying layers and adding more processing steps. It is therefore readily apparent that a method of producing devices of the type described hereinabove is desirable wherein both poly 1 and poly 2 filaments are removed or not formed initially and which do not require the use of an isotropic polysilicon etch or a filament mask.

SUMMARY OF THE INVENTION

Briefly, in accordance with the present invention, the above noted problem of the prior art is minimized and there is provided a method of producing semiconductor devices of the type described hereinabove which eliminates poly 1 filaments between adjacent poly 1 floating gates and eliminates poly 2 filaments between adjacent poly 2 wordlines without the use of an isotropic etch or a filament mask.

The elimination of the poly 1 filament is accomplished by depositing an interlevel oxide/nitride dielectric over a vertical or retrograde poly 1 side wall profile after the poly 1 has been etched (as opposed to the prior art wherein both the interlevel dielectric and the poly 1 are etched together to undesirably expose the poly 1 side wall to deglazes and oxidations). The interlevel oxide/nitride dielectric eliminates the formation of the prior art thick oxide on the side wall of the poly 1 which, as stated above, causes filament formation. It is also necessary that the poly 1 side wall be vertical or retrograde, otherwise the deposited interlevel oxide/nitride dielectric will hide the lower poly 1 corner, causing a poly 1 filament to be formed during the stacked gate etch of an EPROM or EEPROM transistor.

The elimination of poly 2 filaments is accomplished by depositing an oxide over the poly 1 layer after the poly 1 has already been etched. This oxide is then etched, using an anisotropic oxide etch, which forms a side wall oxide (SWOX) on the side of the poly 1 geometries. This side wall oxide performs three functions: first, it fills in the undercut formed during the deglaze, second, it reduces the vertical thickness of the poly 2 next to the sidewalls of the underlying topology and, third, it fills the region under the poly 1 retrograde side wall if a retrograde profile is used to eliminate poly 1 filaments.

The combined use of (1) vertical or retrograde poly 1 side walls with an interlevel oxide/nitride dielectric deposited thereover and (2) a side wall oxide on the side wall of the poly 1 eliminates both poly 1 and poly 2 filaments.

An example process flow for an EPROM incorporating this invention is described hereinbelow.

Initially, moat (the region whereat the transistor will be formed) and field isolation regions are defined in the standard manner. Then threshold voltage adjust implants are performed for poly 1 transistors, the first gate oxide is grown and the poly 1 is deposited again in the standard manner. Next, the poly 1 is etched in a vertical or retrograde manner, the side wall oxide is formed on the poly 1 sidewalls and the interlevel oxide/nitride dielectric is deposited using standard and well known processing procedures for each step. A noncritical pattern is now used to remove the interlevel dielectric from peripheral areas if poly 2 containing transistors are to be constructed in the periphery. Following the threshold voltage adjusts, implants and second gate oxidation, the poly 2 is now deposited and doped in the usual manner. Poly 2 can now be and is etched, using an anisotropic polysilicon etch with normal overetch without leaving poly 2 filaments along the sides of the underlying poly 1 topography. In addition, if the poly 2 and poly 1 stacked structures are to be etched in the same etch sequence, as in the formation of floating gate EPROM or EEPROM structures, both poly 1 and poly 2 filaments will be eliminated. The source and drain implants, multilevel deposition and metalization process are then accomplished in the usual manner.

Although this invention teaches specifically the elimination of poly filaments along underlying poly 1 topography, it can easily be extended to metal filaments from between metal lines over underlying polysilicon topography, or other similar interconnect combinations.

DESCRIPTION OF THE PREFERRED EMBODIMENT

Figure 1:
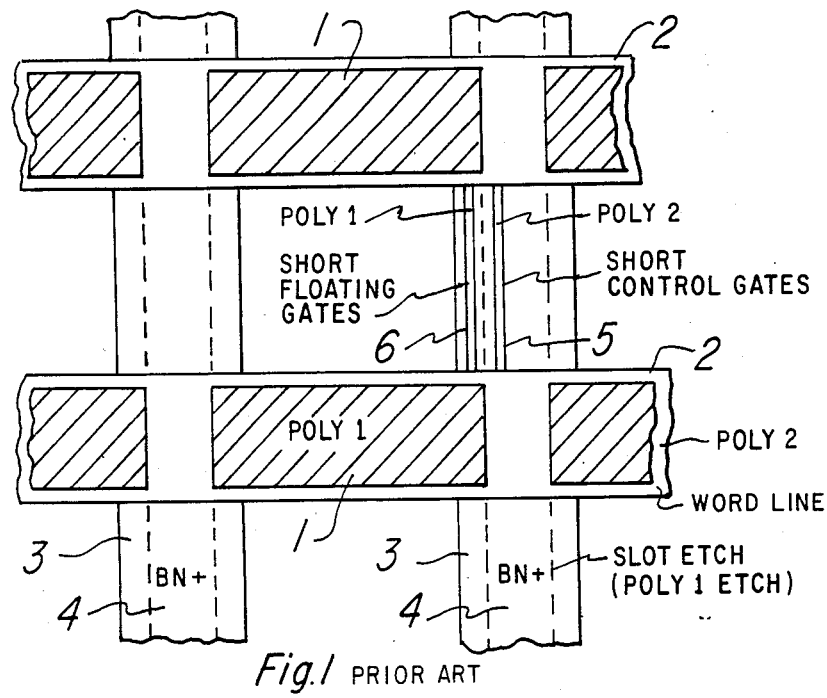
FIG. 1 is a top view of a portion of a semiconductor chip with semiconductor elements thereon of the prior art and showing filaments formed over the BN+ oxide (buried N+ oxide) by the first and second polysilicon layers.

Referring first to FIG. 1, there is shown a top view of a semiconductor device in accordance with the prior art wherein filaments on the surface of the BN+ oxide cause unwanted current to travel between adjacent elements of the semiconductor device. There is shown a buried N+ layer (BN+) 4 which is disposed in a substrate. A BN+ oxide (not shown) is disposed over the substrate and buried layer 4 with a first polysilicon layer 1 (poly 1) thereover. A second polysilicon layer 2 which acts as a word line and which is separated from the first polysilicon layer by an oxide and nitride layer (not shown). A slot 3, as indicated by the dashed lines, is etched in the first polysilicon layer 1 and a filament 5 is shown in the second polysilicon layer 2 acting as a conductor between control gates of adjacent elements on the chip. Also shown is a filament 6 in the first polysilicon layer 1 connecting together the floating gates formed by the first polysilicon layer. It is readily apparent that the filaments 5 and 6 cause unwanted conduction of current between adjacent elements which can vary from small currents to a significant short circuit. In order to reduce and/or eliminate these unwanted filaments, there has been provided a procedure of device manufacture wherein the causes of formation of such filaments is essentially eliminated.

Referring now to FIGS. 2a to 2h, which show the steps involved in formation of devices in accordance with the procedure of a preferred embodiment of the present invention, there is shown the BN+ oxide region 11 of a semiconductor device. It is to be understood that the BN+ oxide is positioned over the semiconductor substrate and isolates individual circuit elements from each other except for conductive regions which may be formed in the substrate itself or which may be formed over the field oxide. All of this is well known in the art.

Figure 2A:
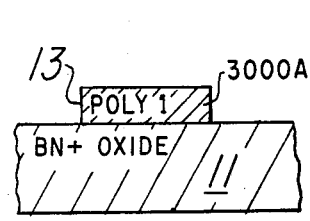
FIGS. 2a to 2h are a series of schematic drawings showing the processing steps required to produce semiconductor devices in accordance with the present invention.

As can be seen in FIG. 2a, there is shown the substrate with BN+ oxide 11, the BN+ oxide being formed in standard manner. A first polysilicon layer (poly 1) 13, preferably having a thickness of about 3000 angstroms and having a vertical or slightly retrograde profile, is deposited using, for example, chemical vapor deposition techniques as are well known. An oxide layer 15 is then deposited over the polysilicon layer 13 and BN+ 11 in standard manner such as by TEOS or with a plasma in a furnace, the oxide layer having an increased thickness adjacent the sides of the layer 13 as is well known and as is shown in FIG. 2b. The TEOS deposition is isotropic, the TEOS being deposited uniformly over the slice. Immediately adjacent to the poly 1 line, the vertical thickness of the oxide is greater than over the substrate or the poly 1 itself. This causes the desirable side wall oxide filament to form in the subsequent anistropic oxide etch. (It fills in the retrograde poly 1 which prevents formation of a poly 2 filament during a later etch). The oxide layer 15 is then anisotropically etched using a standard anisotropic etchant for silicon dioxide until the oxide layer over the polysilicon layer 13 has been removed as shown in FIG. 2c. Since the oxide is removed at the same rate everywhere and since the oxide is thicker at the side walls of the polysilicon layer 13, a side wall oxide 17 remains on the side walls of the polysilicon layer 13.

Figure 2D:
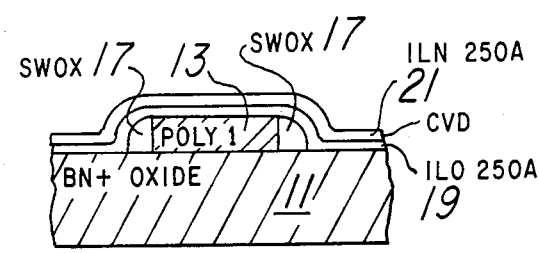
Figure 2B:
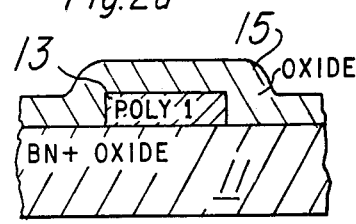
Figure 2E:
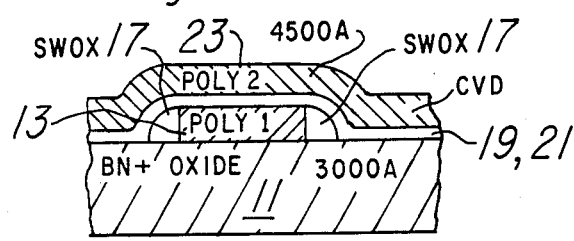
Figure 2C:
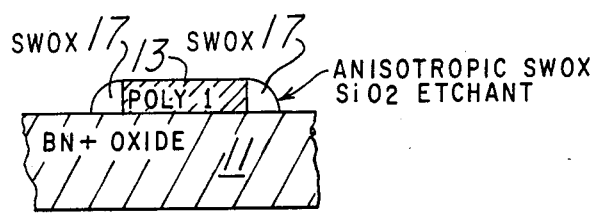
Figure 2F:
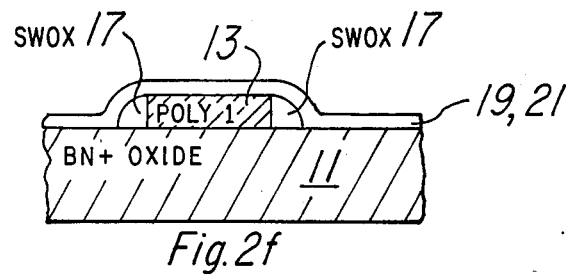
Figure 2G:
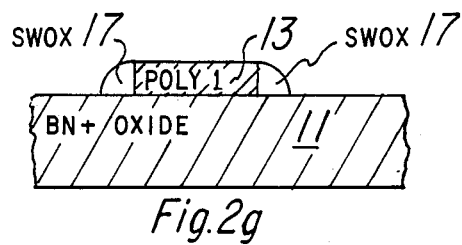
Figure 2H:
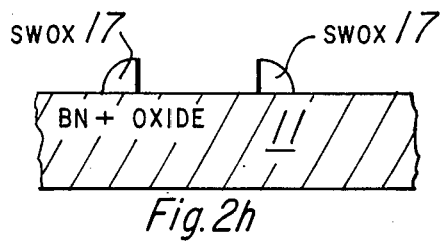

Referring now to FIG. 2d, a 250 angstrom intermediate layer of silicon dioxide (ILO) 19 followed by a 250 angstrom intermediate layer of silicon nitride (ILN) 21 are deposited over the BN+ oxide 11, where exposed, side wall oxide 17 and first polysilicon layer 13, where exposed, by chemical vapor deposition. The ILO/ILN layers prevent oxidation of the poly 1 which would cause a poly 1 filament during a subsequent poly 1 etch. It also prevents undercut of poly 1 from a later oxide deglaze since nitride blocks hydrofluoric acid etch. As shown in FIG. 2e, a 4500 angstrom second layer of polysilicon 23 is then deposited over the intermediate layers 19 and 21. The structure of FIG. 2e is now etched by an in situ stacked gate etch wherein the second polysilicon layer 23 is etched away as shown in FIG. 2f with standard overetching using a standard anisotropic silicon etchant and avoiding formation of poly 2 filaments. The intermediate silicon nitride 21 and silicon dioxide 19 layers are then etched away, using an appropriate etchant therefor as shown in FIG. 2g. The first polysilicon layer 13 is then etched away, using an anisotropic silicon etchant. No poly 1 filaments are formed because of the vertical or slightly retrograde profile of the poly 1 layer. The end result, as is evidenced from FIG. 2h, is that all polysilicon has been removed from the BN+ oxide region, leaving no filaments to conduct current over the field oxide between adjacent elements.

Figure 3:
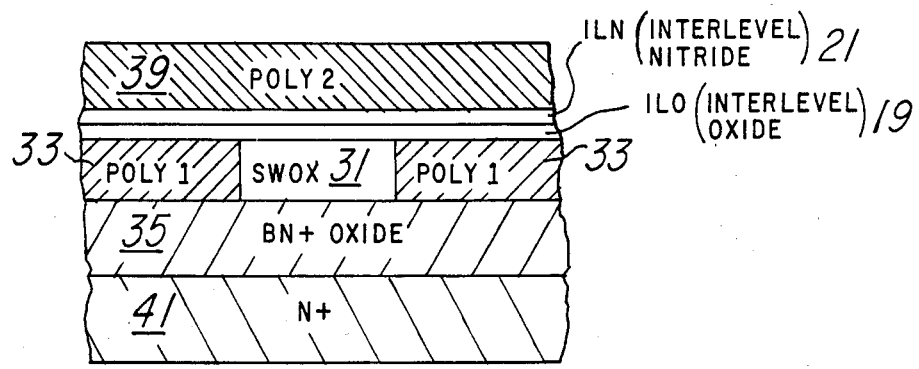
FIG. 3 is a schematic drawing of a second embodiment of a semiconductor device in accordance with the present invention.

Referring now to FIG. 3, there is shown a second embodiment of the invention. This embodiment is similar to that of FIG. 2 except that the side wall oxide 31 is made to occupy the entire space in the slot between two adjacent first polysilicon layer 33 over the BN+ oxide 35. This is accomplished by depositing a thick oxide layer between the two portions of the two adjacent first polysilicon layers 33 so that the side wall oxide remaining after the oxide etch will fill the entire space between said two portions of the first polysilicon layer. This procedure will increase the effective oxide thickness between the second polysilicon layer 39 and the N+ bitline 41 which is buried in the substrate. The increased oxide thickness reduces the control gate to bitline parasitic capacitance, thereby increasing the programming and read speed of the device. Also, the thickness of the buried N+ oxide layer 35 can be reduced by the same thickness as the final side wall oxide thickness without reducing programming or read speed. A reduction in the thickness of the oxide layer 35 results in shallower FAMOS source/drains (N+ bitlines). Shallower FAMOS source/drains reduces short channel effects, allowing a reduction in effective channel length and therefore cell size. Reduced junction depth also increases programming speed.

It can be seen that there has been provided a procedure for semiconductor manufacture wherein the formation of filament over the field oxide region is substantially reduced.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method for fabricating an integrated circuit at a surface of a semiconductor body, comprising:
   forming a first electrode at said surface;
   forming sidewall dielectric structures adjacent the edges of said first electrode;
   forming an interlevel dielectric layer over said first electrode and said sidewall dielectric structures; and
   forming a second electrode over said dielectric layer and overlying a portion of said first electrode.

2. The method of claim 1, wherein said step of forming said interlevel dielectric layer comprises:
   depositing a layer of silicon oxide.

3. The method of claim 2, wherein said step of forming said interlevel dielectric layer further comprises:
   depositing a layer of silicon nitride over said layer of silicon oxide.

4. The method of claim 1, wherein said step of forming a second electrode comprises:
   depositing a polysilicon layer; and
   removing selected portions of said polysilicon layer.

5. The method of claim 4, wherein said step of removing selected portions of said polysilicon layer comprises:
   providing masking material over the portion of said polysilicon layer;
   etching the unmasked portion of said polysilicon layer.

6. The method of claim 5, wherein said etching step also etches a portion of said interlevel dielectric layer underlying the unmasked portion of said polysilicon layer.

7. The method of claim 1, further comprising:
   forming a buried doped region; and
   forming an oxide layer overlying said buried doped region;
wherein said first electrode overlays a portion of said oxide layer.

8. The method of claim 1, further comprising:
   forming first and second buried doped regions;
   forming a first and a second oxide structure overlying said first and said second buried doped regions, respectively; and
   forming a gate dielectric over a portion of said surface lying between said first and second oxide structures;
wherein said first electrode overlies said gate dielectric and extends from an edge of said first oxide structure to an edge of said second oxide structure.

9. The method of claim 8, wherein said first electrode is formed of polysilicon.

10. The method of claim 9, wherein said step of forming said interlevel dielectric layer comprises:
    depositing a layer of silicon oxide.

11. The method of claim 10, wherein said step of forming said interlevel dielectric layer further comprises:
    depositing a layer of silicon nitride over said layer of silicon oxide.

12. The method of claim 9, wherein said step of forming a second electrode comprises:
    depositing a polysilicon layer; and
    removing selected portions of said polysilicon layer.

13. The method of claim 12, wherein said step of removing selected portions of said polysilicon layer comprises:
    providing masking material over the portion of said polysilicon layer;
    etching the unmasked portion of said polysilicon layer.

14. The method of claim 13, wherein said etching step also etches a portion of said interlevel dielectric layer underlying the unmasked portion of said polysilicon layer.

* * * * *